United States Patent
Qiao et al.

(10) Patent No.: US 7,741,149 B2
(45) Date of Patent: Jun. 22, 2010

(54) METHOD OF FABRICATING CHIP PACKAGE STRUCTURE

(75) Inventors: Yong-Chao Qiao, Shanghai (CN); Yan-Yi Wu, Shanghai (CN); Jie-Hung Chiou, Shanghai (CN)

(73) Assignee: ChipMOS Technologies (Bermuda) Ltd., Hamilton (BM)

( * ) Notice: Subject to any disclaimer, the term of this patent is extended or adjusted under 35 U.S.C. 154(b) by 0 days.

(21) Appl. No.: 12/423,811

(22) Filed: Apr. 15, 2009

(65) Prior Publication Data

US 2009/0197374 A1    Aug. 6, 2009

Related U.S. Application Data

(62) Division of application No. 11/734,252, filed on Apr. 11, 2007.

(30) Foreign Application Priority Data

Feb. 8, 2007    (CN) .................. 2007 1 0005145

(51) Int. Cl.
*H01L 21/44* (2006.01)
*H01L 21/48* (2006.01)
*H01L 21/50* (2006.01)

(52) U.S. Cl. ................ 438/106; 438/123; 257/E21.499
(58) Field of Classification Search ................ 438/106, 438/111, 123, 124; 257/E21.499
See application file for complete search history.

(56) References Cited

U.S. PATENT DOCUMENTS 6,989,294 B1 *    1/2006    McLellan et al. ............ 438/111

* cited by examiner

*Primary Examiner*—Hoai v Pham
(74) *Attorney, Agent, or Firm*—Jianq Chyun IP Office

(57) ABSTRACT

A chip package structure includes a chip, a lead frame, first and second bonding wires, an upper encapsulant, a first lower encapsulant, and a second lower encapsulant. The chip has an active surface, a back surface, and chip bonding pads disposed on the active surface. The lead frame having an upper surface and a lower surface includes a die pad, leads, and at least a bus bar. The back surface of the chip is adhered to the die pad. The leads surround the die pad. The bus bar is disposed between the die pad and the leads. The first bonding wires are connected to the chip bonding pads and the bus bar. The second bonding wires are connected to the bus bar and the leads. The upper encapsulant encapsulates the upper surface of the lead frame, the chip, the first bonding wires, and the second bonding wires.

9 Claims, 7 Drawing Sheets

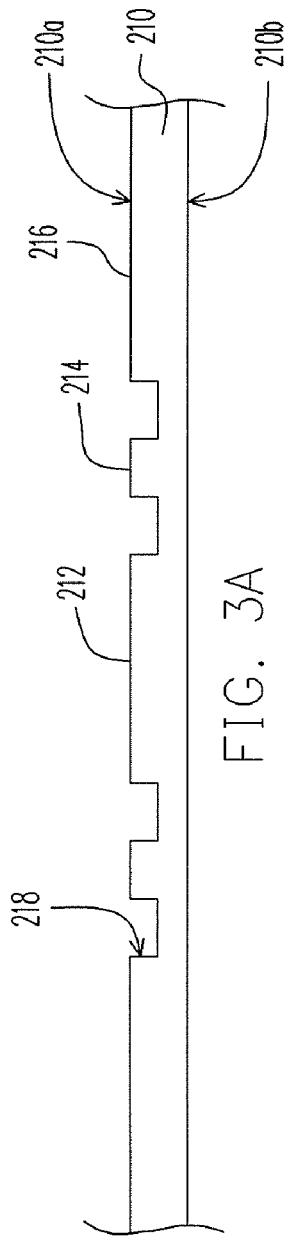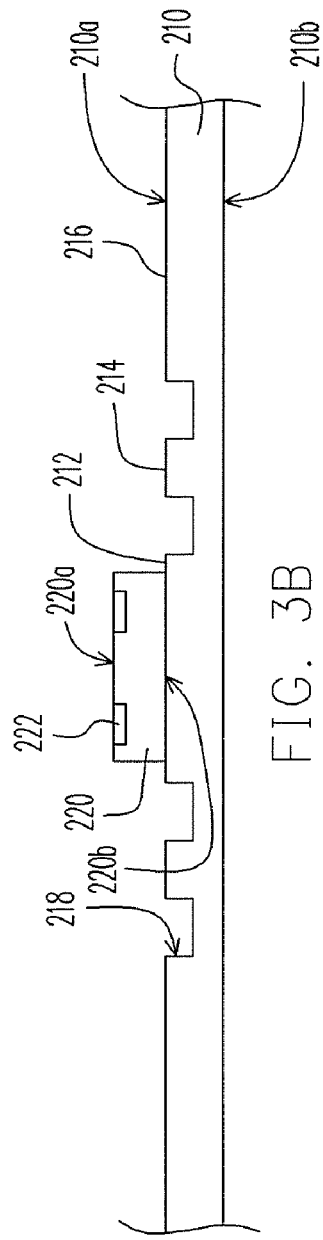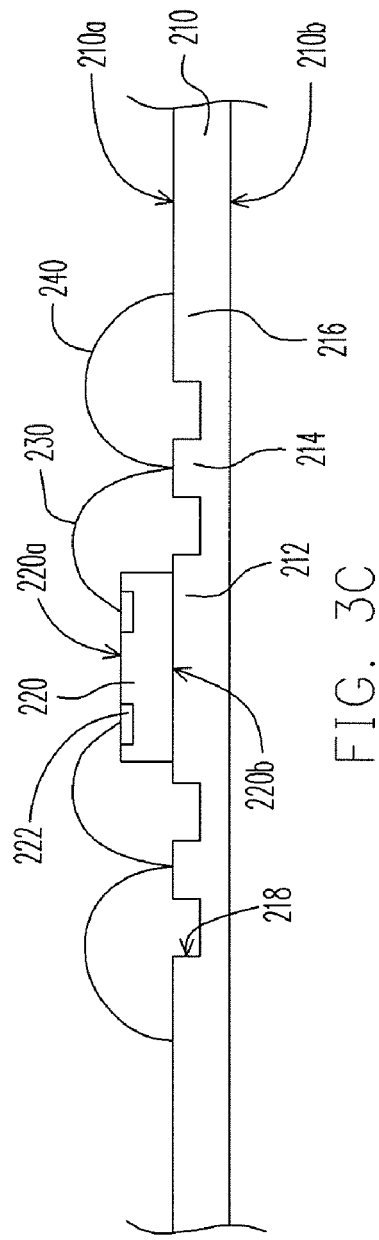

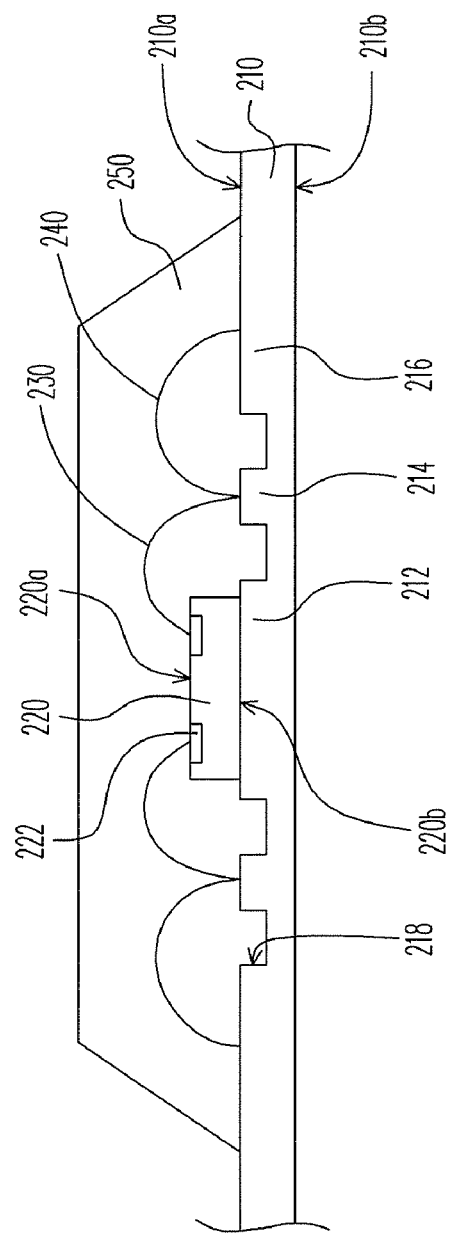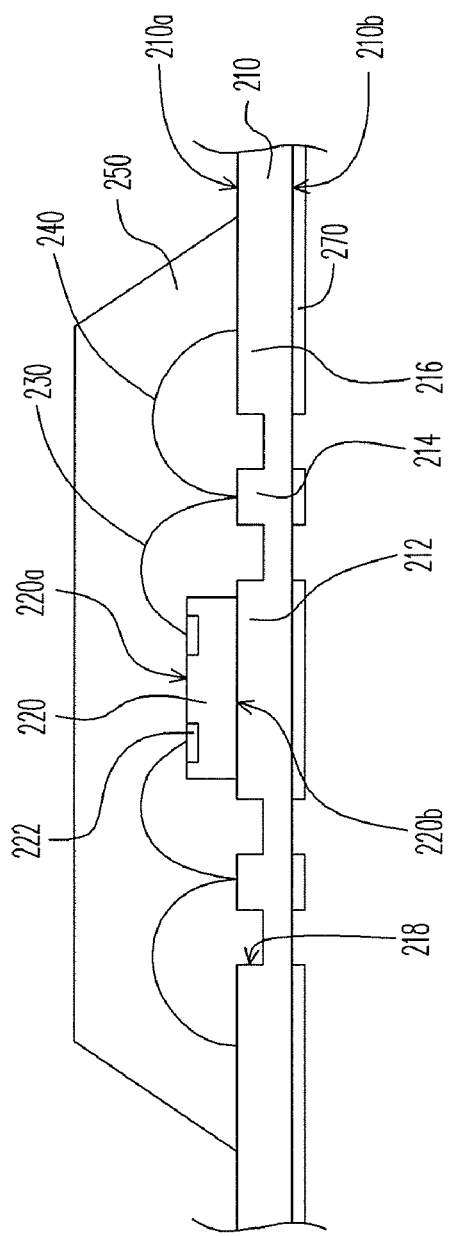

METHOD OF FABRICATING CHIP PACKAGE STRUCTURE

CROSS-REFERENCE TO RELATED APPLICATION

This application is a divisional of and claims the priority benefit of an application Ser. No. 11/734,252, filed on Apr. 11, 2007, now pending, which claims the priority benefit of China application serial no. 200710005145.0, filed on Feb. 8, 2007. The entirety of each of the above-mentioned patent applications is hereby incorporated by reference herein and made a part of this specification.

BACKGROUND OF THE INVENTION

1. Field of the Invention

The present invention relates to a chip package structure. More particularly, the present invention relates to a chip package structure with a lead frame.

2. Description of Related Art

The production of integrated circuit (IC) devices is mainly divided into three stages including IC design, IC process and IC package.

During the IC process, a chip is manufactured by the steps of wafer fabrication, IC formation, wafer sawing and so on. A wafer has an active surface, which generally refers to the surface including active devices. After the IC inside the wafer is completely formed, a plurality of bonding pads is further disposed on the active surface of the wafer, such that the chip formed by sawing the wafer may be externally electrically connected to a carrier through the bonding pads. The carrier is, for example, a lead frame or a package substrate. The chip can be connected to the carrier by wire bonding or by flip chip bonding, such that the bonding pads on the chip are electrically connected to contacts of the carrier, thereby forming a chip package structure.

FIG. 1 is a schematic top view of a conventional chip package. FIG. 2 is a schematic cross-sectional view showing the conventional chip package of FIG. 1. For the convenience of illustration, please refer to FIGS. 1 and 2 which are schematic perspective diagrams seen through a molding compound 140. Only dotted lines are adopted in FIGS. 1 and 2 for showing the profile of the molding compound 140. The chip package 100 includes a lead frame 110, a chip 120, a plurality of first bonding wires 130, a plurality of second bonding wires 132, a plurality of third bonding wires 134, and the molding compound 140. The lead frame 110 includes a die pad 121, a plurality of inner leads 114, and a plurality of bus bars 116. The inner leads 114 are disposed at the periphery of the die pad 112. The bus bars 116 are disposed between the die pad 112 and the inner leads 114.

The chip 120 includes an active surface 122 and a back surface 124 which are opposite to each other. The chip 120 is disposed on the die pad 112, and the back surface 124 of the chip 120 faces the die pad 112. The chip 120 includes a plurality of ground contacts 126 and a plurality of non-ground contacts 128 having a plurality of power contacts and a plurality of signal contacts. The ground contacts 126 and the non-ground contacts 128 are both disposed on the active surface 122.

The first bonding wires 130 electrically connect the ground contacts 126 to the bus bars 116. The second bonding wires 132 electrically connect the bus bars 116 to ground leads of the inner leads 114. And the third bonding wires 134 electrically connect the rest of the inner leads 114 to the corresponding second contacts 128, respectively. The molding compound 140 encapsulates the die pad 112, the inner leads 114, the bus bars 116, the chip 120, the first bonding wires 130, the second bonding wires 132 and the third bonding wires 134.

It should be noted that the conventional chip package structure 100 utilizes a patterned lead frame in the packaging process. The lead frame 110 includes one die pad 112, a plurality of the inner leads 114 and a plurality of the bus bars 116. However, masks required in the photolithography process of patterning the lead frame are rather expensive, thereby increasing additional manufacturing costs of the lead frame.

SUMMARY OF THE INVENTION

The present invention is directed to a chip package structure and a method of fabricating the same, so as to reduce the packaging costs arisen from directly employing patterned lead frames in a conventional chip packaging process. Specifically, a metal thin plate is used in the present invention, and a die pad, a bus bar and leads of the lead frame are formed on the metal thin plate through performing an etching step during the packaging process, which is helpful to save the production costs of the chip package structure.

On the other hand, in the present invention, a lower encapsulant having a concave portion is used as an etching mask in the etching process to replace the conventional photomask. Thereby, the costs of the photomasks are significantly reduced, and the packaging costs are further decreased.

To resolve the foregoing issues, the present invention provides a method of fabricating a chip package structure. The method includes the following steps. First, a metal thin plate including an upper surface and a lower surface is provided. The upper surface of the metal thin plate has a first protrusion part, a second protrusion part, and a plurality of third protrusion parts. The second protrusion part is sandwiched between the first protrusion part and the third protrusion parts. The first, the second, and the third protrusion parts are connected to one another. Next, a chip is provided. The chip has an active surface, a back surface, and a plurality of chip bonding pads disposed on the active surface. Thereafter, the back surface of the chip is adhered to the first protrusion part. After that, a plurality of first bonding wires and a plurality of second bonding wires are formed. Here, the first bonding wires respectively connect the chip bonding pads and the second protrusion part, and the second bonding wires respectively connect the second protrusion part and the third protrusion parts. Afterwards, an upper encapsulant is formed. The upper encapsulant encapsulates the upper surface of the metal thin plate, the chip, the first bonding wires and the second bonding wires. Next, an etching mask is formed on the lower surface of the metal thin plate, so as to expose the connections among the first, the second, and the third protrusion parts. Eternally, the metal thin plate is etched to an extent that the first, the second, and the third protrusion parts are electrically insulated, such that the first protrusion part constructs a die pad, the second protrusion part forms a bus bar, and the third protrusion parts frame a plurality of leads.

According to one embodiment of the present invention, the method of fabricating the chip package structure further includes forming a lower encapsulant filled among the die pad, the bus bar and the leads after the step of etching the metal thin plate is implemented.

According to one embodiment of the present invention, the lower encapsulant is coplanar with the etching mask.

According to one embodiment of the present invention, the lower encapsulant further encapsulates the etching mask.

According to one embodiment of the present invention, the method of fabricating the chip package structure further includes removing the etching mask and then forming the lower encapsulant after the step of etching the metal thin plate is implemented.

According to one embodiment of the present invention, the metal thin plate is a copper foil.

According to one embodiment of the present invention, the first bonding wires and the second bonding wires are formed through a wire bonding technique.

According to one embodiment of the present invention, the etching mask is a patterned photoresist layer or a patterned solder mask layer.

According to one embodiment of the present invention, one of the first protrusion part, the second protrusion part and the third protrusion parts or a combination thereof has a down-set design.

The present invention further provides a chip package structure including a chip, a lead frame, a plurality of first bonding wires, a plurality of second bonding wires, an upper encapsulant, a first lower encapsulant, and a second lower encapsulant. The chip has an active surface, a back surface, and a plurality of chip bonding pads disposed on the active surface. The lead frame having an upper surface and a lower surface corresponding to the upper surface includes a die pad, a plurality of leads, and at least a bus bar. The back surface of the chip is adhered to the die pad. The leads surround the die pad. The bus bar is disposed between the die pad and the leads. The first bonding wires are connected to the chip bonding pads and to the bus bar, respectively, while the second bonding wires are connected to the bus bar and to the leads, respectively. The upper encapsulant encapsulates the upper surface of the lead frame, the chip, the first bonding wires, and the second bonding wires.

According to one embodiment of the present invention, the chip package structure further includes an etching mask disposed on the lower surface of the lead frame.

According to one embodiment of the present invention, the chip package structure further includes a lower encapsulant filled among the die pad, the bus bar and the leads.

According to one embodiment of the present invention, the lower encapsulant further encapsulates the etching mask in the chip package structure.

According to one embodiment of the present invention, the chip package structure further includes an etching mask disposed on the lower surface of the bus bar and the lower surface of the leads.

According to one embodiment of the present invention, the chip package structure further includes a lower encapsulant filled among the die pad, the bus bar and the leads, and the lower surface of the die pad is exposed.

According to one embodiment of the present invention, the chip package structure further includes an etching mask disposed on the lower surface of the die pad and the lower surface of the bus bar.

According to one embodiment of the present invention, the chip package structure further includes a lower encapsulant filled among the die pad, the bus bar and the leads, and the lower surface of the leads is exposed.

According to one embodiment of the present invention, the chip package structure further includes an etching mask disposed on the lower surface of the bus bar.

According to one embodiment of the present invention, the chip package structure further includes a lower encapsulant filled among the die pad, the bus bar and the leads, and the lower surface of the die pad and the lower surface of the leads are exposed.

According to one embodiment of the present invention, the chip package structure further includes a lower encapsulant filled among the die pad, the bus bar and the leads, and the lower surface of the lead frame is encapsulated.

According to one embodiment of the present invention, one of the die pad, the chip and the leads or a combination thereof has a down-set design.

The method of fabricating the chip package structure disclosed in the present invention includes disposing the chip on the metal thin plate at first and forming the necessary bonding wires and the molding compound on the chip and on the metal thin plate. Finally, a portion of the metal thin plate is etched, so as to form the die pad, the bus bar and the leads of the lead frame.

In order to make the aforementioned and other objects, features and advantages of the present invention more comprehensible, several embodiments accompanied with figures are described in detail below.

BRIEF DESCRIPTION OF THE DRAWINGS

FIGS. 3A through 3G are schematic cross-sectional views depicting a process of fabricating a chip package structure according to one embodiment of the present invention.

DESCRIPTION OF EMBODIMENTS

Figure 1:
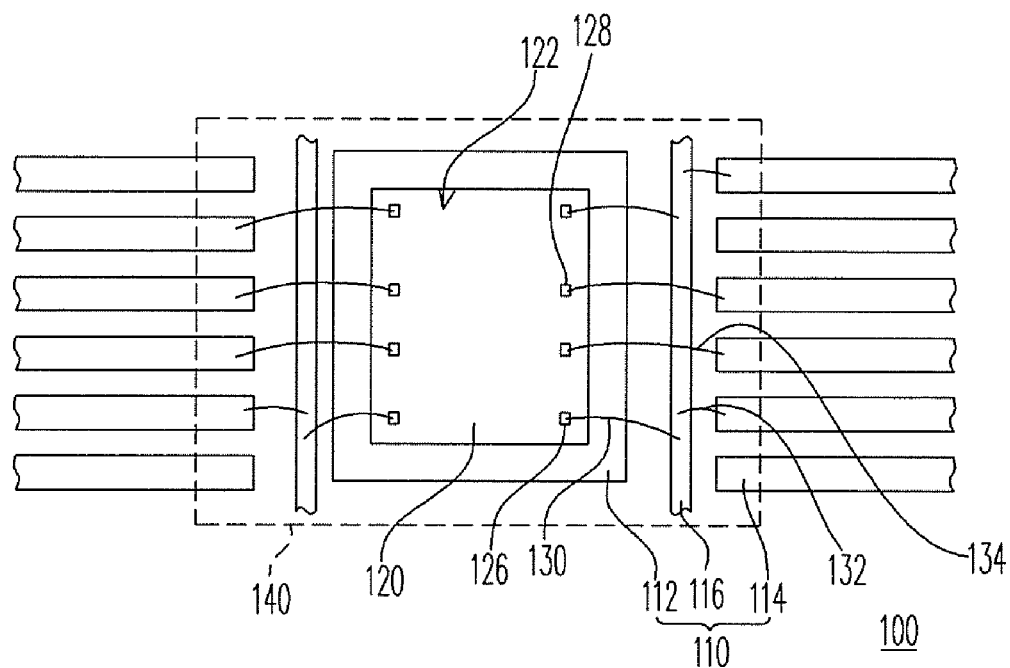
FIG. 1 is a schematic top view of a conventional chip package.
Figure 2:
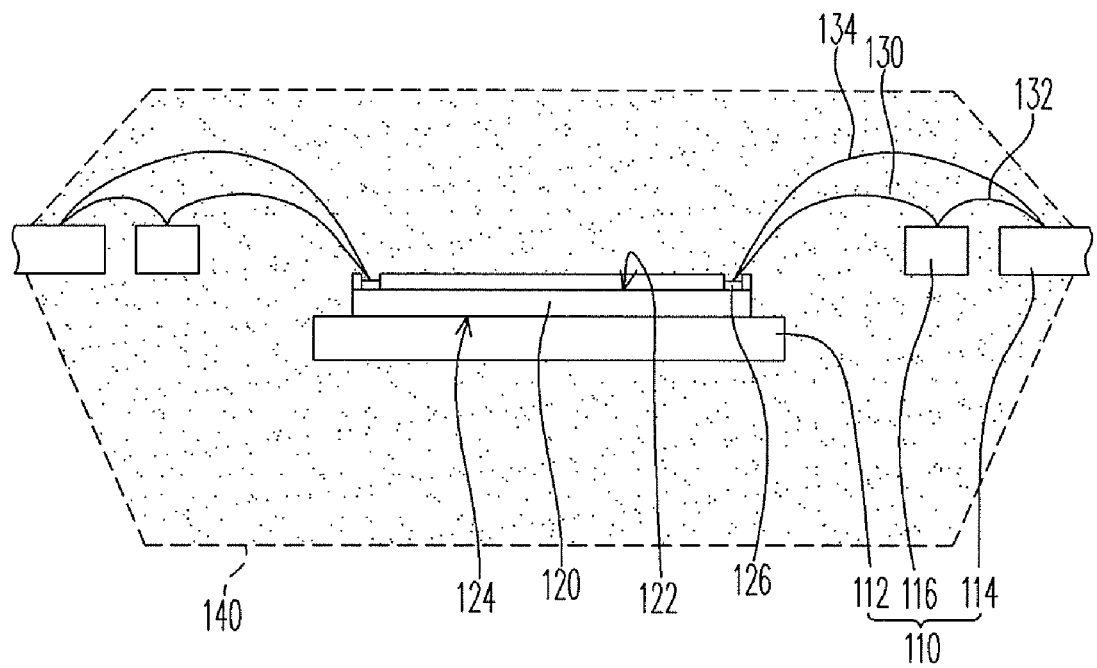
FIG. 2 is a schematic cross-sectional view of the conventional chip package of FIG. 1.

FIGS. 3A through 3G are schematic cross-sectional views showing a process of fabricating a chip package structure according to a first embodiment of the present invention. First, referring to FIG. 3A, a metal thin plate 210 having an upper surface 210a and a lower surface 210b opposite to each other is provided. A plurality of concave portions 218 is formed on the metal thin plate 210, so as to divide the upper surface 210a into a first protrusion part 212, a second protrusion part 214, and a plurality of third protrusion parts 216. The second protrusion part 214 is disposed outside the first protrusion part 212, and the third protrusion parts 216 are disposed outside the second protrusion part 214. The first protrusion part 212, the second protrusion part 214 and the third protrusion parts 216 are connected to one another. Moreover, the first protrusion part 212, the second protrusion part 214 and the third protrusion parts 216 are respectively shaped as a die pad, a bus bar and leads, and thereby the die pad, the bus bar and the leads of the lead frame can be further constructed in subsequent processes. According to the present embodiment, the metal thin plate 210 may be made of a copper foil.

Next, referring to FIG. 3B, a chip 220 having an active surface 220a, a back surface 220b, and a plurality of chip bonding pads 222 is provided. Here, the active surface 220a is opposite to the back surface 220b, and the chip bonding pads 222 are disposed on the active surface 220a. Thereafter, the back surface 220b of the chip 220 is adhered to the first protrusion part 212 through utilizing an ultraviolet curing glue or a thermal curing glue.

After that, referring to FIG. 3C, a plurality of first bonding wires 230 and a plurality of second bonding wires 240 are formed. Here, the first bonding wires 230 respectively connect the chip bonding pads 222 and the second protrusion part 214, and the second bonding wires 240 respectively connect the second protrusion part 214 and the third protrusion parts 216. The first bonding wires 230 and the second bonding wires 240 may be formed through a wire bonding technique.

Afterwards, as indicated in FIG. 3D, an upper encapsulant 250 is formed. The upper encapsulant 250 encapsulates the upper surface 210a of the metal thin plate 210, the chip 220, the first bonding wires 230 and the second bonding wires 240.

Then, referring to FIG. 3E, an etching mask 270 is formed on the lower surface 210b of the metal thin plate 210. The etching mask 270 exposing the connections among the first protrusion part 212, the second protrusion part 214, and the third protrusion parts 216 may be a patterned photoresist layer or a patterned solder mask layer.

Figure 3F:
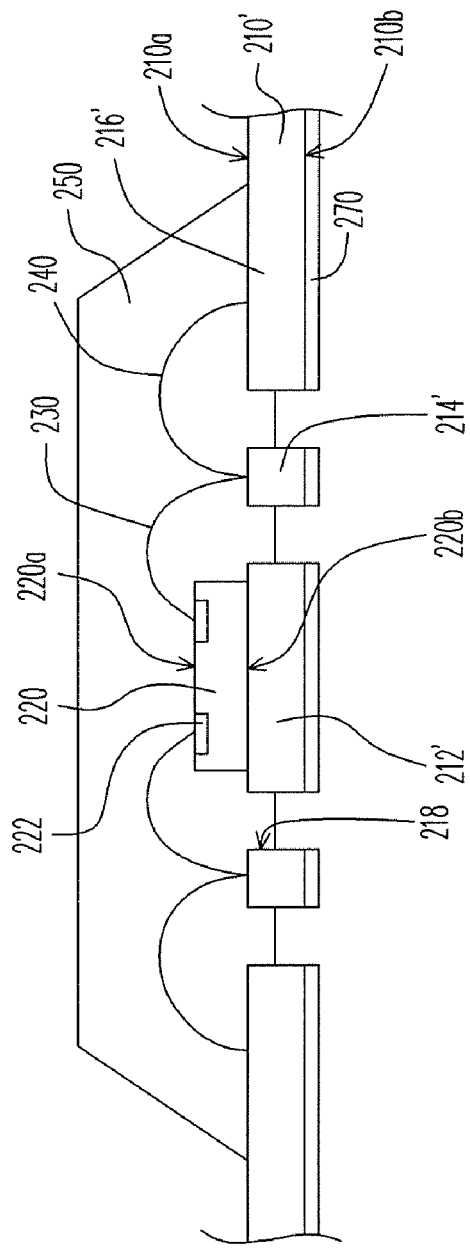

Next, with reference to FIG. 3F, the metal thin plate 210 is etched to an extent that the first protrusion part 212, the second protrusion part 214, and the third protrusion parts 216 are electrically insulated, such that the first protrusion part 212 constructs a die pad 212' of a lead frame 210', the second protrusion part 214 forms a bus bar 214', and the third protrusion parts 216 form a plurality of leads 216'. Thus far, the process of fabricating the chip package structure 200 is completed.

Figure 3G:
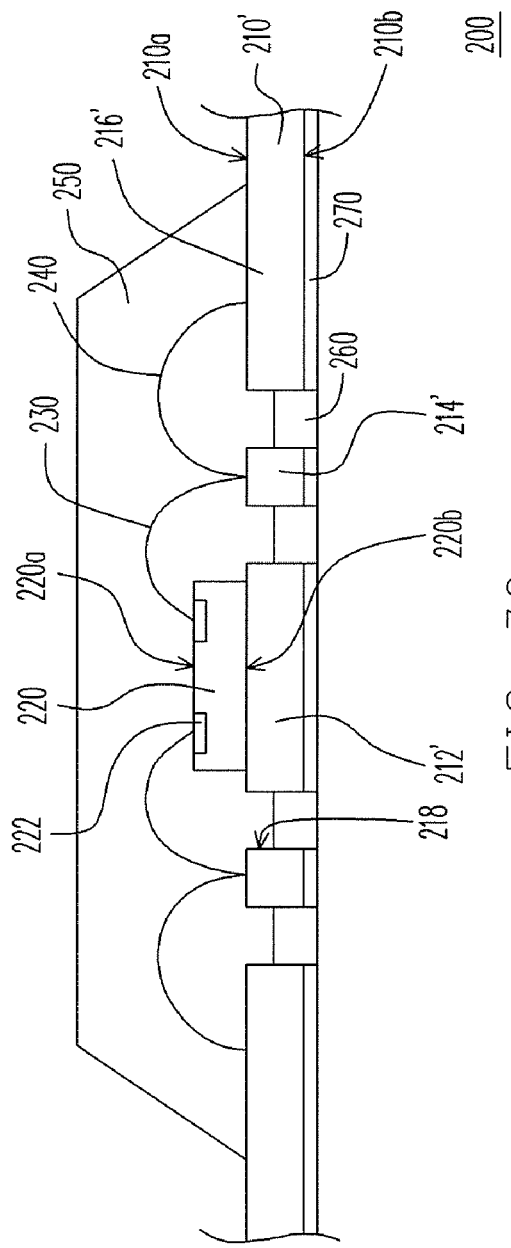

Referring to FIG. 3G, to prevent the die pad 212', the bus bar 214' and the leads 216' from being oxidized due to exposure to the air, a lower encapsulant 260 is filled among the die pad 212', the bus bar 214' and the leads 216'. Here, the lower encapsulant 260 is coplanar with the etching mask 270.

Figure 4:
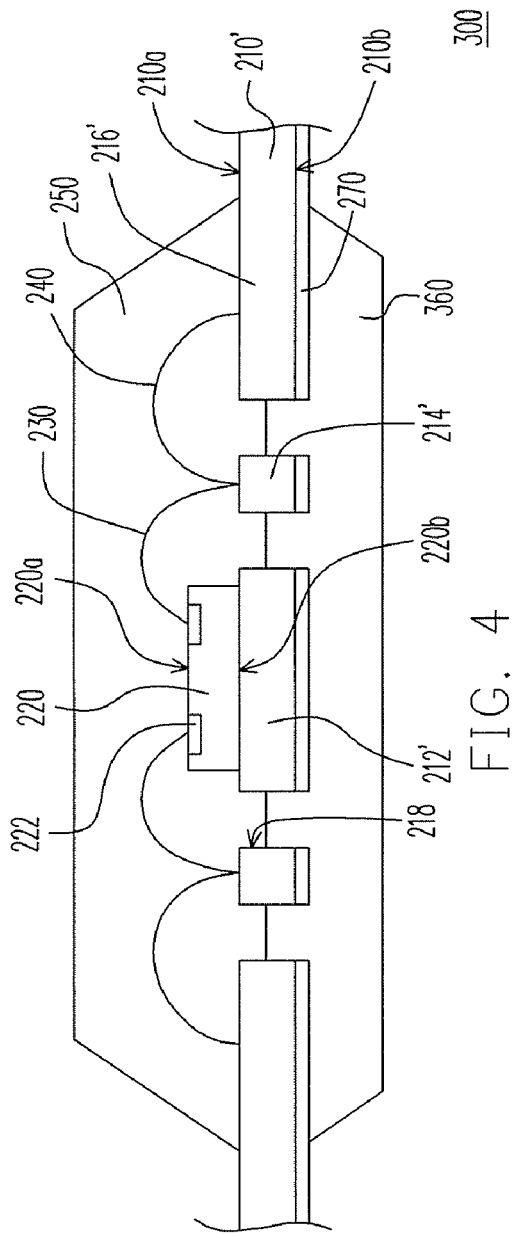
FIG. 4 is a schematic cross-sectional view of a chip package structure according to another embodiment of the present invention.

Besides, the lower encapsulant 260 can be arranged in other manners, which is not limited in the present invention. FIG. 4 is a schematic cross-sectional view of a chip package structure according to another embodiment of the present invention. Referring to FIG. 4, in the present embodiment, a lower encapsulant 360 of a chip package structure 300 not only fills a die pad 212', a bus bar 214' and a plurality of leads 216', but also encapsulates a lower surface 210b of a metal thin plate 210 and an etching mask 270.

Figure 5:
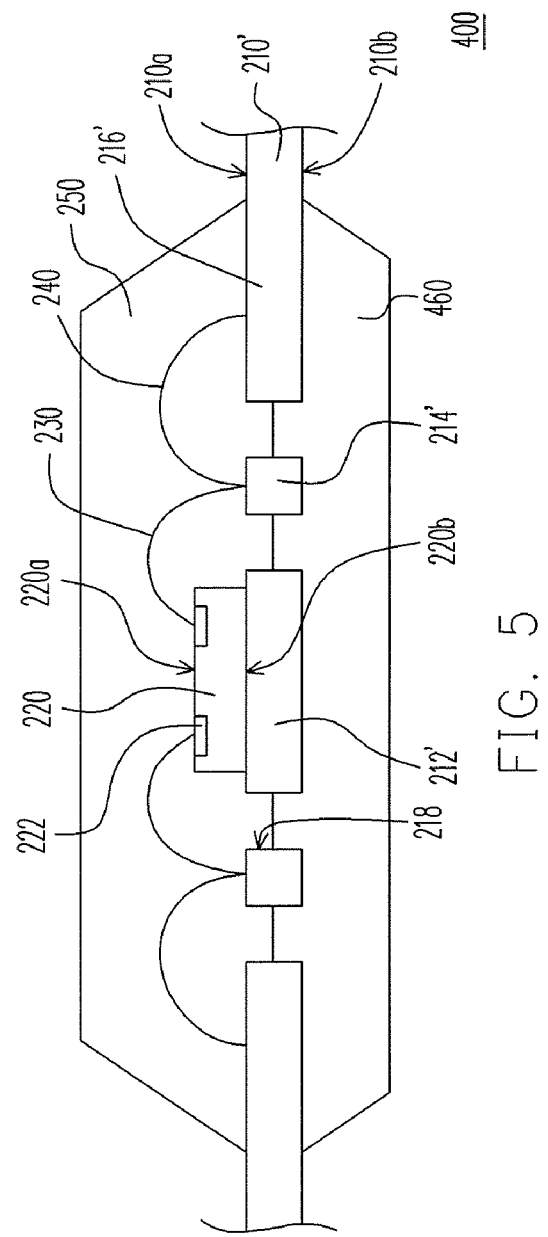
FIG. 5 is a schematic cross-sectional view of a chip package structure according to still another embodiment of the present invention.

FIG. 5 is a schematic cross-sectional view of a chip package structure according to still another embodiment of the present invention. Referring to FIG. 5, during the fabrication of a chip package structure 400, an etching mask 270 may be firstly removed after the step of etching a metal thin plate 210 is implemented. A lower encapsulant 460 is then formed and encapsulates a lower surface 210b of the metal thin plate 210. Here, the method of removing the etching mask 270 includes, for example, dissolving the etching mask 270 with use of an organic solvent.

Second Embodiment

Figure 6:
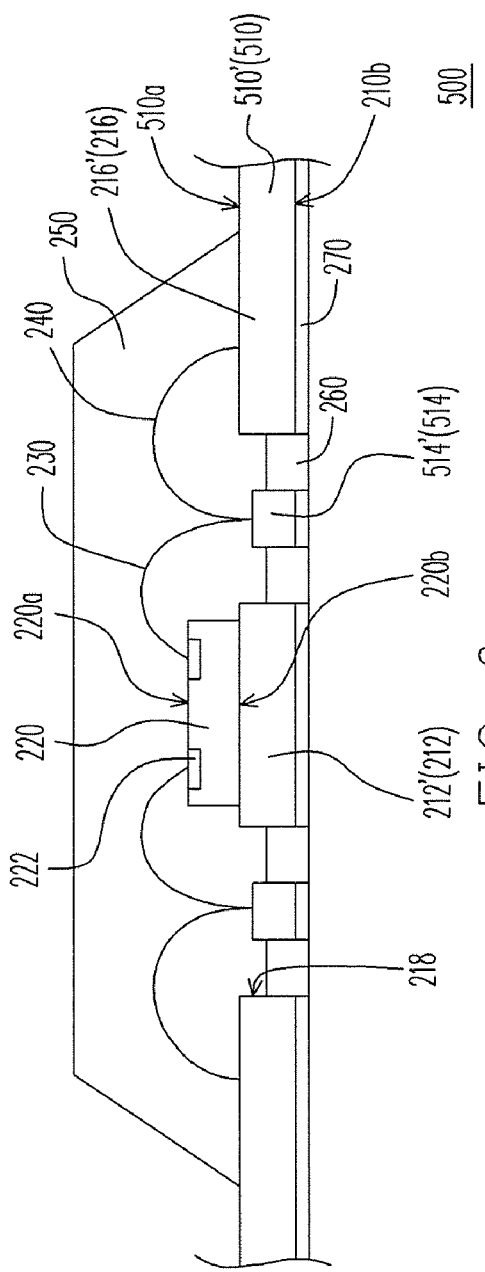
FIG. 6 is a schematic cross-sectional view depicting a chip package structure according to a second embodiment of the present invention.

FIG. 6 is a schematic cross-sectional view of a chip package structure according to a second embodiment of the present invention. It should be noted that the same or similar reference numbers used in the second embodiment and in the first embodiment represent the same or the like elements, and the second embodiment is approximately identical to the first embodiment. The difference between the two embodiments will be described hereinafter, and the similarities therebetween are omitted.

Referring to FIG. 6, the difference between the second embodiment and the first embodiment lies in that a second protrusion part 514 of a metal thin plate 510 has a down-set design in a chip package structure 500. That is to say, an upper surface 510a of the second protrusion part 514 is lower than the upper surface 510a of a first protrusion part 212 and the upper surface 510a of a plurality of third protrusion parts 216. After a lead frame 510' of the metal thin plate 510 is formed, and the first protrusion part 212, the second protrusion part 214 and the third protrusion parts 216 form a die pad 212', a bus bar 514' and a plurality of leads 216', respectively, the lead frame 514' then has the down-set design, thereby optimizing mold-flow balance. Moreover, people skilled in the art may also enable the die pad 212' or the leads 216' to have the down-set design, or allow a combination of any two of the die pad 212', the bus bar 514' and the leads 216' to have the down-set design, which is not limited in the present invention.

Third Embodiment

Figure 7:
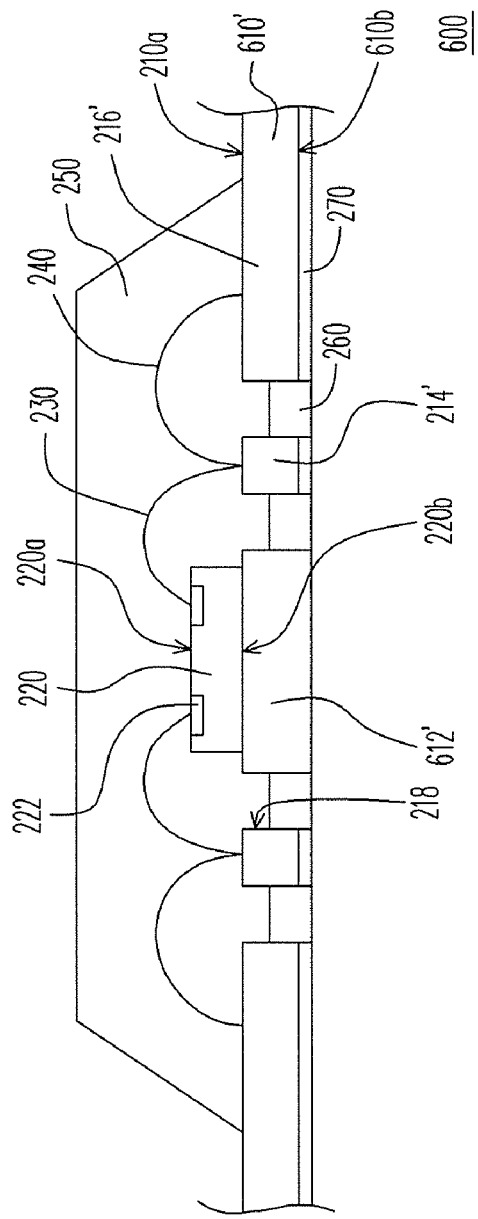
FIG. 7 is a schematic cross-sectional view of a chip package structure according to a third embodiment of the present invention.

FIG. 7 is a schematic cross-sectional view of a chip package structure according to a third embodiment of the present invention. It should be noted that the same or similar reference numbers used in the third embodiment and in the first embodiment represent the same or the like elements, and the third embodiment is approximately identical to the first embodiment. The difference between the two embodiments is described hereinafter, and the similarities therebetween are omitted.

Please refer to FIG. 7. The difference between the third embodiment and the first embodiment lies in that a thickness of a die pad 612' exceeds the thicknesses of a bus bar 214' and of a plurality of leads 216' in a lead frame 610' of a chip package structure 600. And an upper surface 210a of the die pad 612' is coplanar with the upper surface 210a of the bus bar 214' and the upper surface 210a of the leads 216'. After the fabrication of the chip package structure 600 is basically completed, an etching mask 270 on a lower surface 610b of the die pad 612' is removed, such that the lower surface 610b of the die pad 612' is directly contacted to the external world, which effectively improves the heat dissipation efficiency of the chip package structure 600.

Figure 8:
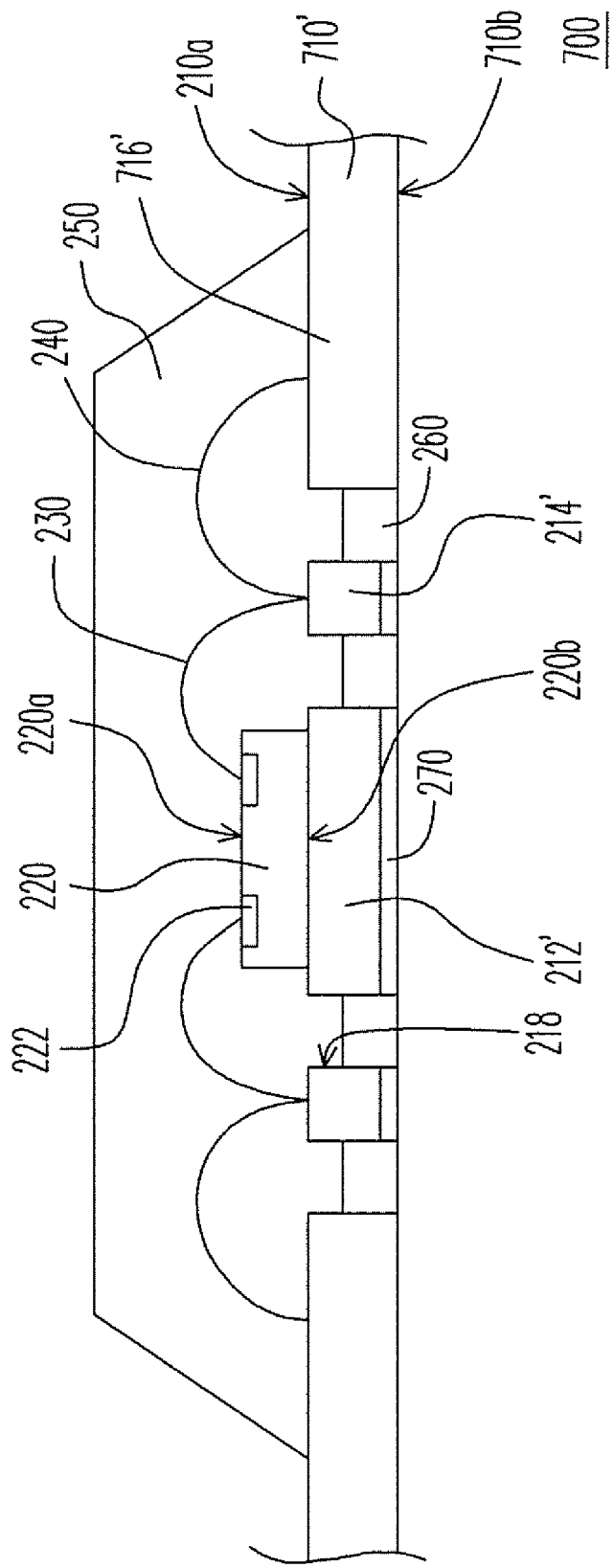
FIG. 8 is a schematic cross-sectional view of a chip package structure according to yet still another embodiment of the present invention.

Besides, the etching mask and a lower encapsulant may expose the lower surface of the leads as well. FIG. 8 is a schematic cross-sectional view of a chip package structure according to yet still another embodiment of the present invention. Referring to FIG. 8, in a lead frame 710' of a chip package structure 700, an etching mask 270 and a lower encapsulant 260 expose a lower surface 710b of a plurality of leads 716'. Thereby, the chip package structure 700 may be applied to a package structure having no leads, such as a quad flat no-lead (QFN) package structure. Aside from the above, people skilled in the art may also enable the etching mask and the lower encapsulant to expose the lower surface of the other parts of the lead frame. For example, the lower surface of the leads and the lower surface of the die pad are simultaneously exposed by the etching mask and the lower encapsulant, which is not limited in the present invention.

In view of the foregoing, the present invention provides a method of fabricating a brand new chip package structure. The method includes the steps of providing the metal thin plate that has the first protrusion part, the second protrusion part and the third protrusion parts. The chip is then disposed on the metal thin plate, and the bonding wires are formed to electrically connect the chip to the second protrusion part and connect the second protrusion part to the third protrusion parts. Next, the upper encapsulant is formed on the upper surface and the lower surface of the metal thin plate, respectively. Thereafter, the etching mask is formed on the lower surface of the metal think plate and exposes the connections among the first, the second, and the third protrusion parts. Finally, the metal thin plate is etched, such that the first protrusion part, the second protrusion part and the third protrusion parts form the die pad, the bus bar and the leads of the lead frame, respectively.

In comparison with the conventional method of fabricating the chip package structure with direct use of the patterned lead frame as the carrier, the method disclosed in the present invention is implemented by disposing the chip on the metal thin plate, forming the necessary bonding wires and the molding compound, and etching a portion of the metal thin plate so as to form the die pad, the bus bar and the leads of the lead frame. With use of the metal thin plate in the present invention, the die pad, the bus bar and the leads are formed on the metal thin plate through performing the etching step during the packaging process, which is conducive to saving the production costs of the chip package structure and to reducing the packaging costs arisen from directly employing the patterned lead frame in the conventional chip packaging process.

In addition, in the chip package structure disclosed in the present invention, one of the die pad, the bus bar and the leads or the combination of any two of the die pad, the bus bar and the leads may have the down-set design, so as to optimize mold-flow balance. Moreover, in the chip package structure disclosed in the present invention, the lower surface of the die pad can be exposed by the etching mask and by the lower encapsulant, which effectively improves the heat dissipation efficiency of the chip package structure. Furthermore, the lower surface of the leads can also be exposed by the etching mask and by the lower encapsulant, such that the chip package structure of the present invention can be applied to the package structure having no leads.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a chip package structure, comprising:
   providing a metal thin plate comprising an upper surface and a lower surface, wherein the upper surface of the metal thin plate has a first protrusion part, a second protrusion part, and a plurality of third protrusion parts, the second protrusion part being sandwiched between the first protrusion part and the third protrusion parts, the first, the second, and the third protrusion parts being connected to one another;
   providing a chip having an active surface, a back surface, and a plurality of chip bonding pads disposed on the active surface;
   adhering the back surface of the chip to the first protrusion part;
   forming a plurality of first bonding wires and a plurality of second bonding wires, wherein the first bonding wires respectively connect the chip bonding pads and the second protrusion part, and the second bonding wires respectively connect the second protrusion part and the third protrusion parts;
   forming an upper encapsulant encapsulating the upper surface of the metal thin plate, the chip, the first bonding wires and the second bonding wires;
   forming an etching mask on the lower surface to expose the connections among the first, the second, and the third protrusion parts; and
   etching the metal thin plate to an extent that the first, the second, and the third protrusion parts are electrically insulated, such that the first protrusion part constructs a die pad, the second protrusion part forms a bus bar, and the third protrusion parts form a plurality of leads.

2. The method of fabricating the chip package structure of claim 1, further comprising forming a lower encapsulant filled among the die pad, the bus bar and the leads after the step of etching the metal thin plate is implemented.

3. The method of fabricating the chip package structure of claim 2, wherein the lower encapsulant is coplanar with the etching mask.

4. The method of fabricating the chip package structure of claim 2, wherein the lower encapsulant further encapsulates the etching mask.

5. The method of fabricating the chip package structure of claim 2, further comprising removing the etching mask and then forming the lower encapsulant after the step of etching the metal thin plate is implemented.

6. The method of fabricating the chip package structure of claim 1, wherein the metal thin plate is a copper foil.

7. The method of fabricating the chip package structure of claim 1, wherein the first bonding wires and the second bonding wires are formed through a wire bonding technique.

8. The method of fabricating the chip package structure of claim 1, wherein the etching mask is a patterned photoresist layer or a patterned solder mask layer.

9. The method of fabricating the chip package structure of claim 1, wherein one of the first protrusion part, the second protrusion part and the third protrusion parts or a combination thereof has a down-set design.

* * * * *